(12) United States Patent
Tong et al.

(10) Patent No.: US 7,614,888 B2
(45) Date of Patent: Nov. 10, 2009

(54) FLIP CHIP PACKAGE PROCESS

(75) Inventors: Ho-Ming Tong, Taipei (TW); Shin-Hua Chao, Kaohsiung (TW); Ming-Chiang Lee, Kaohsiung (TW); Tai-Yuan Huang, Kaohsiung County (TW); Chao-Yuan Liu, Kaohsiung (TW); Yung-Cheng Huang, Kaohsiung (TW); Teck-Chong Lee, Kaohsiung (TW); Jen-Chieh Kao, Kaohsiung (TW); Jau-Shoung Chen, Hsinchu County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/237,052

(22) Filed: Sep. 24, 2008

(65) Prior Publication Data
US 2009/0087947 A1 Apr. 2, 2009

(30) Foreign Application Priority Data
Oct. 2, 2007  (TW) .............................. 96136976 A

(51) Int. Cl.
H01L 21/00 (2006.01)

(52) U.S. Cl. ...................... 439/108; 438/112; 438/124; 438/127; 257/778; 257/E21.503; 257/E21.511

(58) Field of Classification Search ................. 438/108, 438/112, 124, 127; 257/E21.503, E21.511
See application file for complete search history.

(56) References Cited

U.S. PATENT DOCUMENTS

| 6,667,124 | B2 * | 12/2003 | Suenaga et al. ............... 429/35 |
| 7,481,641 | B2 * | 1/2009 | Fuergut et al. ............ 425/129.1 |
| 2005/0224953 | A1 * | 10/2005 | Lee et al. ..................... 257/704 |
| 2008/0187615 | A1 * | 8/2008 | Gao et al. ................ 425/405.1 |
| 2009/0026656 | A1 * | 1/2009 | Bautista et al. ........ 264/272.17 |

* cited by examiner

*Primary Examiner*—Walter L Lindsay, Jr.
*Assistant Examiner*—Ron E Pompey
(74) *Attorney, Agent, or Firm*—J.C. Patents

(57) ABSTRACT

A flip chip package process is provided. First, a substrate strip including at least one substrate is provided. Next, at least one chip is disposed on the substrate, and the chip is electrically connected to the substrate. Then, a stencil having at least one opening and an air slot hole is disposed on an upper surface of the substrate strip, an air gap is formed between the stencil and the substrate strip, the air gap connects the opening and the air slot hole, and the chip is located in the opening. Finally, a liquid compound is formed into the opening of the stencil to encapsulate the chip, and a vacuum process is performed through the air slot hole and the air gap, so as to prevent the air inside the opening from being encapsulated by the liquid compound to become voids.

12 Claims, 7 Drawing Sheets

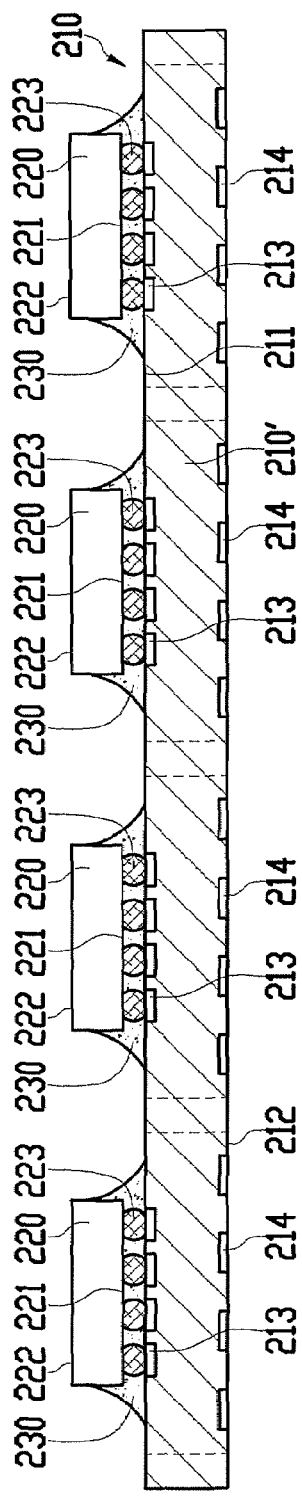
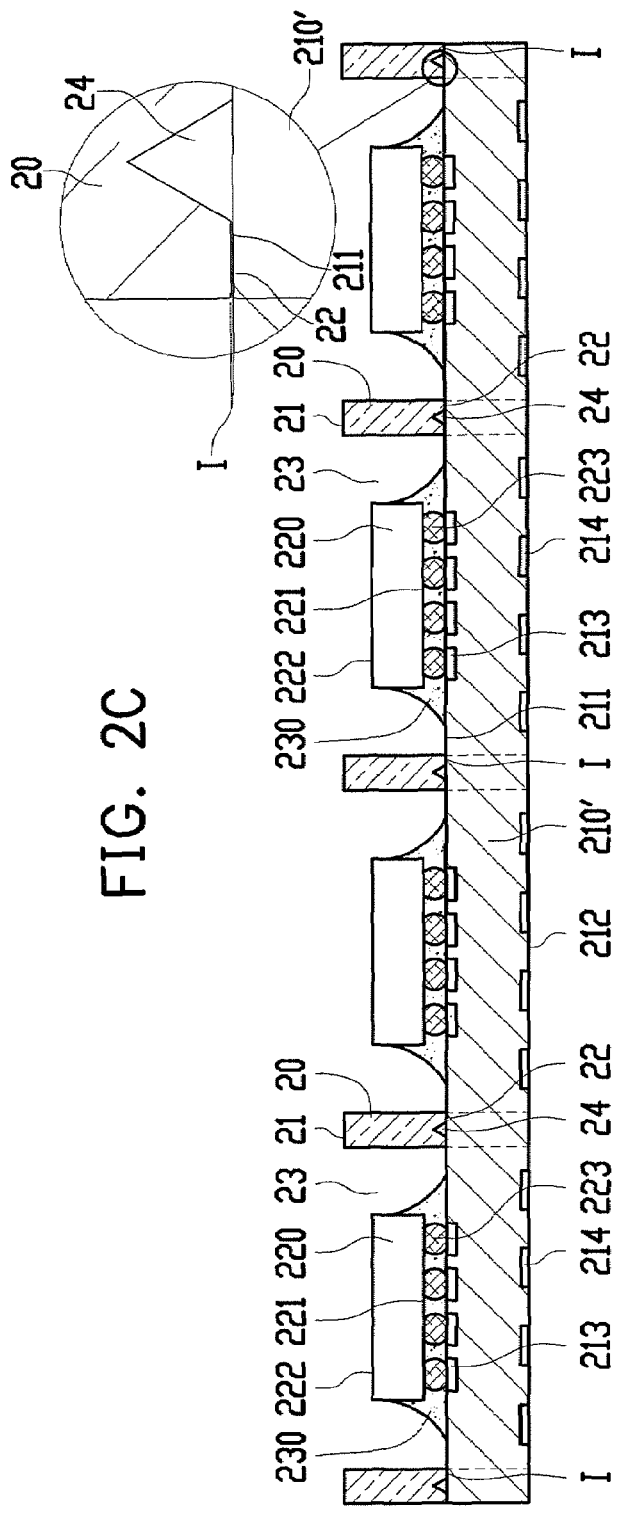
FIG. 2C
FIG. 2D

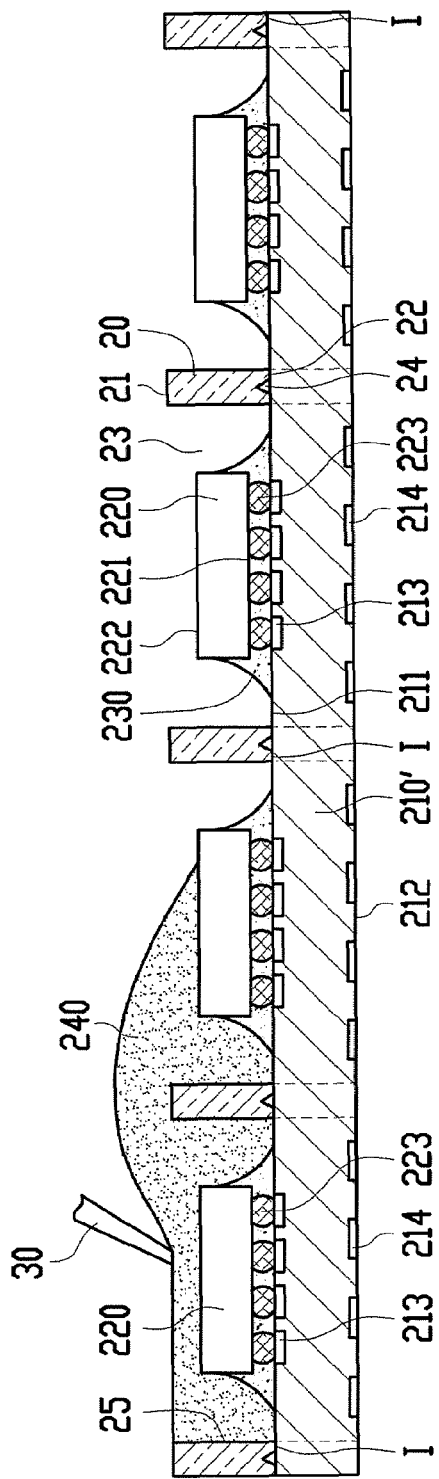
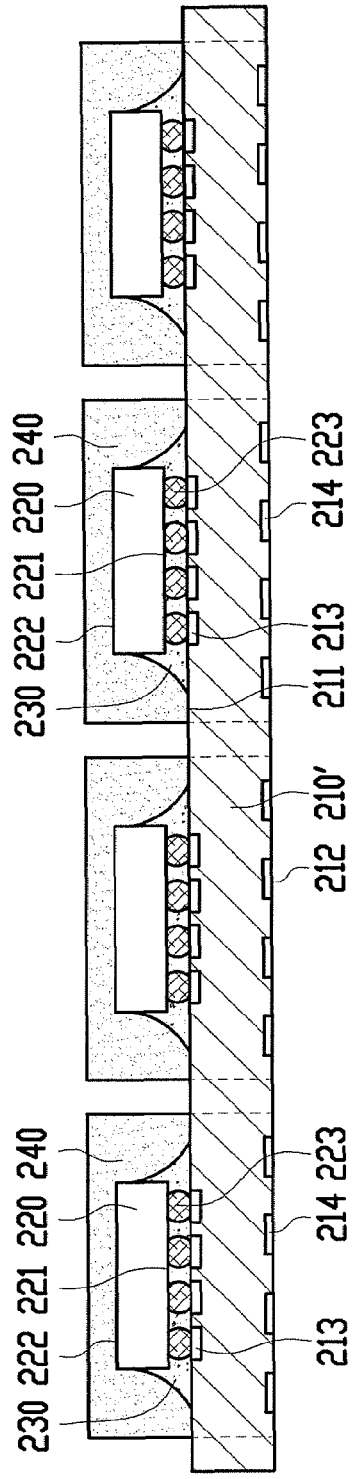
FIG. 2E
FIG. 2F

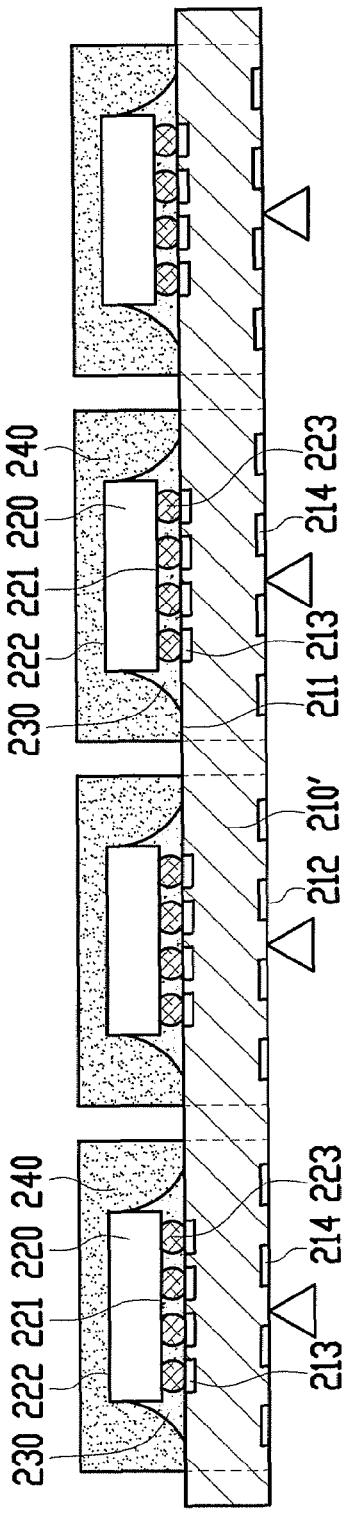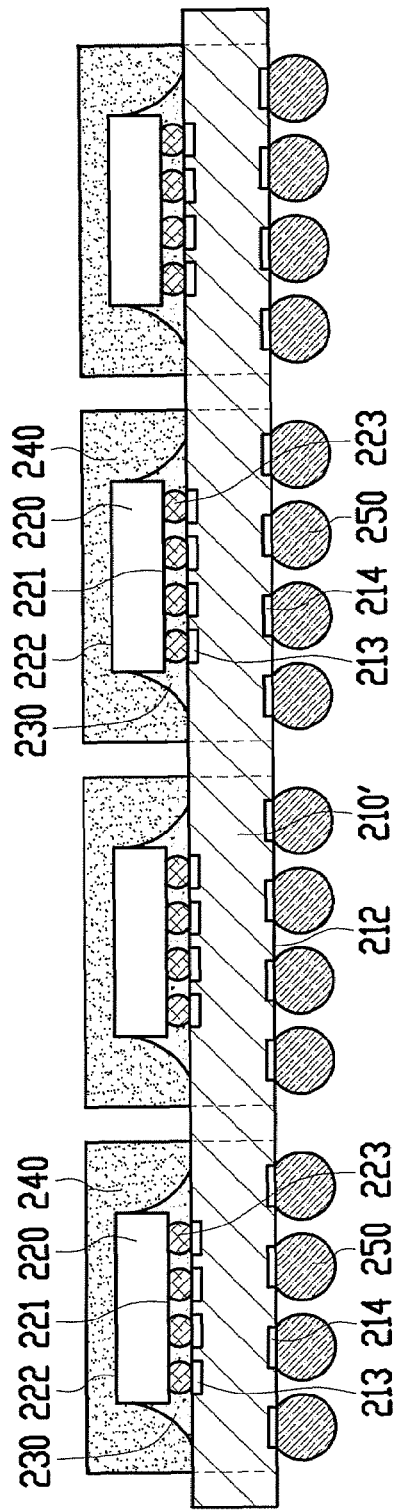

FLIP CHIP PACKAGE PROCESS

CROSS-REFERENCE TO RELATED APPLICATION

This application claims the priority benefit of Taiwan application serial no. 96136976, filed on Oct. 2, 2007. The entirety of the above-mentioned patent application is hereby incorporated by reference herein and made a part of specification.

BACKGROUND OF THE INVENTION

1. Field of the Invention

The present invention relates to a package process, in particular, to a package process for preventing that the air is encapsulated by a liquid compound to form voids.

2. Description of Related Art

A conventional package process includes a dispensing package process to seal and protect chips. As shown in FIG. 1, a plurality of chips 120 is disposed on an upper surface 111 of a substrate strip 110, and then, a dispensing process is performed by using a dispensing tool 10. However, during the dispensing process, if a flowing speed of a liquid compound 130 is not controlled properly, the air is likely to be encapsulated in the package structure, and thus, voids V are generated in the package structure. As a result, the electrical conductivity or heat conductivity gets deteriorated, and even the service life of the package structure is affected.

SUMMARY OF THE INVENTION

Accordingly, the present invention is directed to a flip chip package process. First, a substrate strip with an upper surface and a lower surface is provided, and the substrate strip includes at least one substrate. Next, a chip is disposed on the substrate and is electrically connected to the substrate. Then, a stencil is disposed on the upper surface of the substrate strip, in which the stencil includes a first surface, a second surface, an opening extending from the first surface to the second surface, and an air slot hole formed on the second surface; an air gap is formed between the stencil and the substrate strip; the air gap connects the opening and the air slot hole; and the chip is located in the opening. Finally, a liquid compound is formed into the opening of the stencil to encapsulate the chip, and then, a vacuum process is performed through the air slot hole and the air gap. According to the present invention, the vacuum process is performed while the liquid compound is formed, and the air inside the opening is evacuated by utilizing the characteristic that the air gap connects the opening and the air slot hole, so as to prevent the air from being remained in the package structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A to 2I are schematic cross-sectional views of a flip chip package process according to a first embodiment of the present invention.

DESCRIPTION OF EMBODIMENTS

Figure 1:
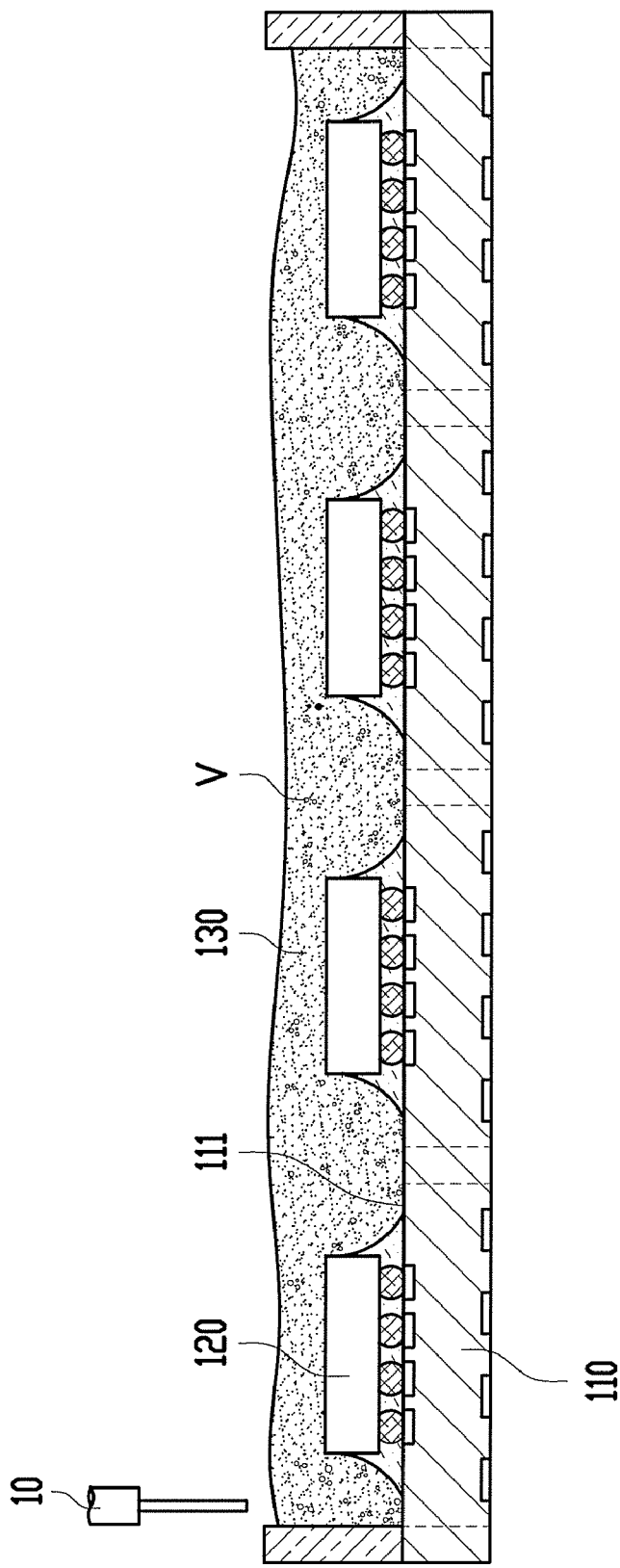
FIG. 1 is a schematic cross-sectional view showing voids generated when forming a liquid compound through dispensing in a conventional flip chip package process.
Figure 2A:
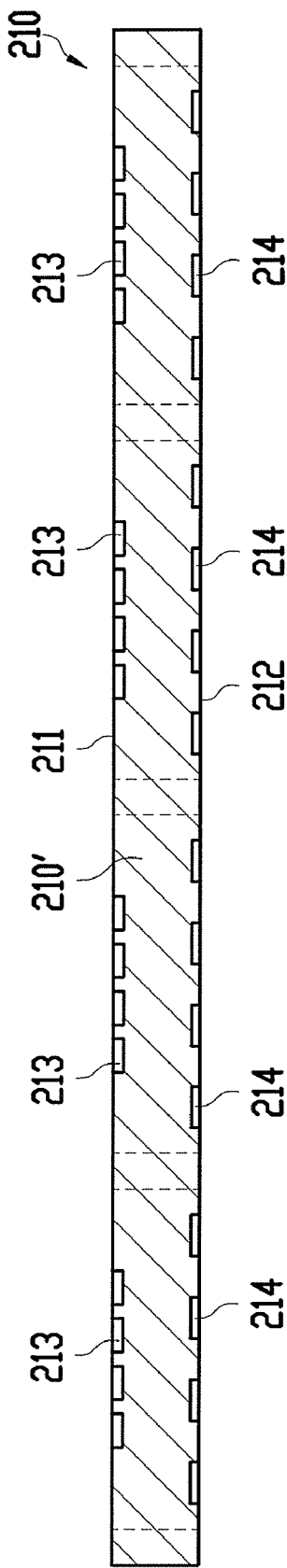
Figure 2B:
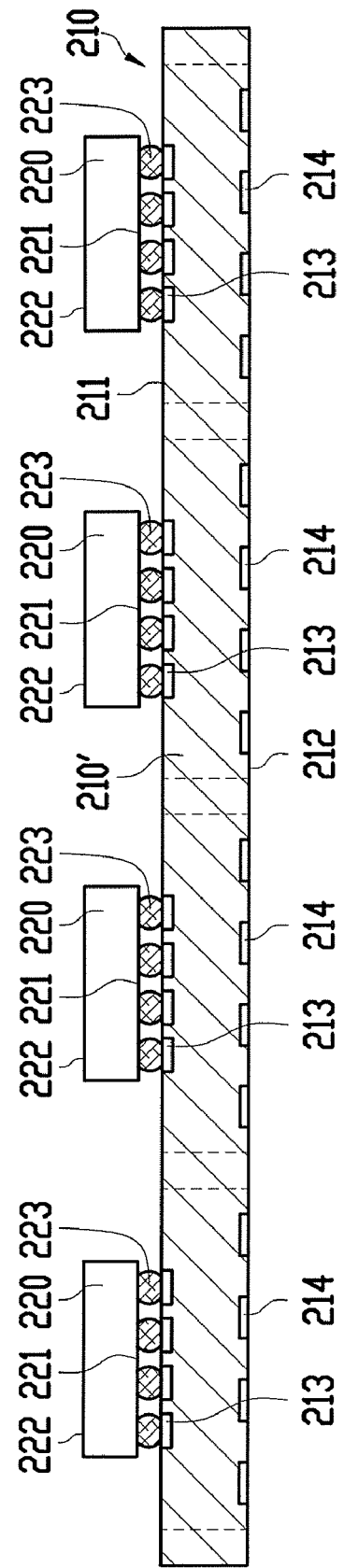
Figure 21:
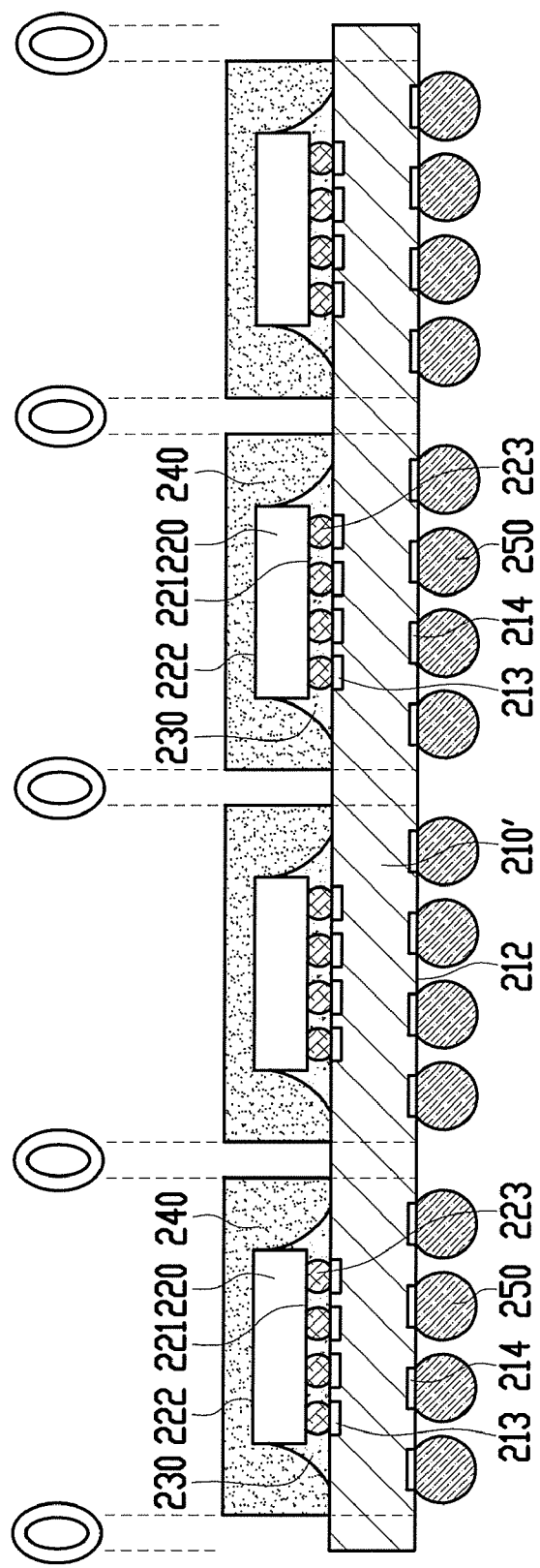

FIGS. 2A to 2I are schematic cross-sectional views of a flip chip package process according to an embodiment of the present invention. First, referring to FIG. 2A, a substrate strip 210 is provided. The substrate strip 210 includes at least one substrate 210', and in this embodiment, the substrate strip 210 includes a plurality of substrates 210'. The substrate strip 210 has an upper surface 211 and a lower surface 212. The upper surface 211 and the lower surface 212 of the substrate strip 210 are respectively an upper surface and a lower surface of the substrates 210'. The substrates 210' have a plurality of first connection pads 213 and a plurality of second connection pads 214. The first connection pads 213 are formed on the upper surface 211, and the second connection pads 214 are formed on the lower surface 212. Next, referring to FIG. 2B, a plurality of chips 220 is disposed on the substrates 210', and each chip 220 has an active surface 221, a back surface 222, and a plurality of bumps 223. The bumps 223 of the chips 220 are electrically connected to the first connection pads 213 of the substrates 210'. Then, referring to FIG. 2C, an underfill 230 is formed on the upper surface 211 of the substrate strip 210. The underfill 230 encapsulates the bumps 223 of the chips 220 and exposes the back surfaces 222 of the chips 220.

Next, referring to FIG. 2D, a stencil 20 is disposed on the upper surface 211 of the substrate strip 210. The stencil 20 has a first surface 21, a second surface 22, at least one opening 23, and at least one air slot hole 24. In this embodiment, the stencil 20 has a plurality of openings 23 corresponding to the chips 220. An air gap I is formed between the second surface 22 of the stencil 20 and the upper surface 211 of the substrate strip 210. The openings 23 extend from the first surface 21 to the second surface 22. The air slot hole 24 is formed on the second surface 22. The air gap I connects the openings 23 and the air slot hole 24. The chips 220 are located in the openings 23. Alternatively, in another embodiment, the air slot hole 24 is directly connected with the openings 23. Then, referring to FIG. 2E, a liquid compound 240 is formed into the openings 23 of the stencil 20 to encapsulate the chips 220, and then, a vacuum process is performed. During this process, the liquid compound 240 may be filled into the stencil 20 by using a scraper 30, and the liquid compound 240 is formed into the openings 23 of the stencil 20 by a squeezing process. The liquid compound 240 encapsulates the chips 220 and contacts an inner side wall 25 of the stencil 20. During this process, the air gap I connects the openings 23 and the air slot hole 24, and thus the air in the openings 23 is evacuated when the liquid compound 240 is formed into the openings 23 of the stencil 20, so as to prevent the air from being encapsulated into the liquid compound 240 to form voids.

Figure 3:
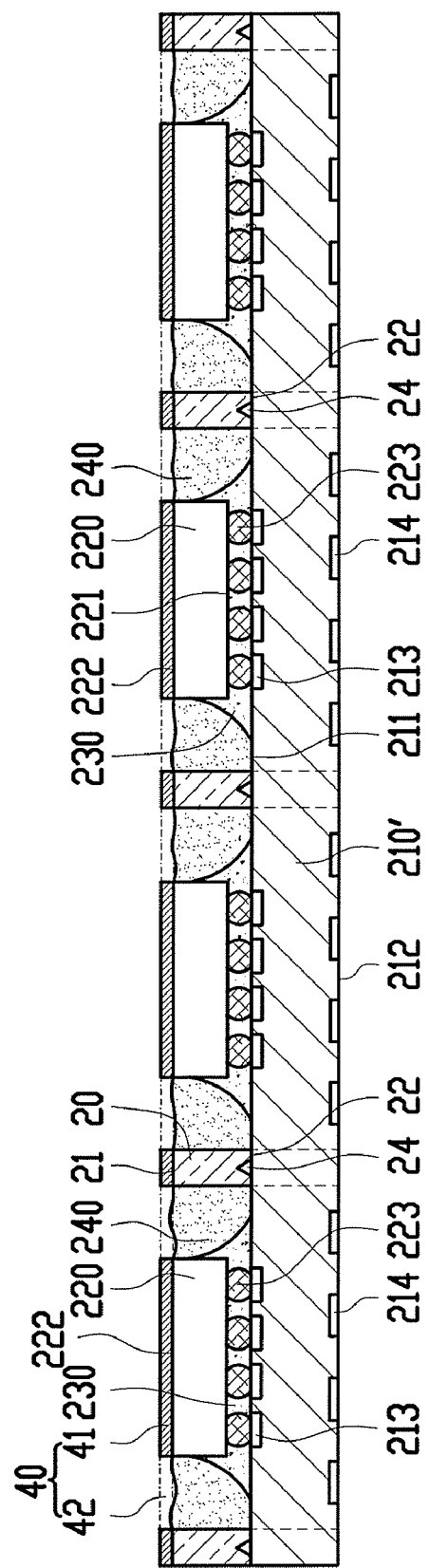
FIG. 3 is a schematic cross-sectional view of another flip chip package structure with a screen covering a back surface of a chip according to a second embodiment of the present invention.

Referring to FIG. 3, a screen 40 is further disposed on the first surface 21 of the stencil 20 before the liquid compound 240 is formed on the upper surface 211 of the substrate strip 210. The screen 40 has a plurality of masking parts 41 and a plurality of hollow parts 42. The masking parts 41 cover the back surfaces 222 of the chips 220 to prevent the liquid compound 240 from covering the back surfaces 222 of the chips 220, and the back surfaces 222 of the chips 220 are exposed after the screen 40 is removed, thus improving the heat dissipation efficacy.

Then, referring to FIG. 2F, a pre-baking process is performed to cure the liquid compound 240 into a semi-curing state, and the stencil 20 is removed. Then, referring to FIG. 2G, a heating process is performed to cure the liquid compound 240. Then, referring to FIG. 2H, a plurality of solder balls 250 is formed on the lower surface 212 of the substrate strip 210. The solder balls 250 are connected to the second connection pads 214. Finally, referring to FIG. 2I, the substrate strip 210 is cut into a plurality of isolated flip chip package structures. According to the present invention, a vacuum process is performed during the process of forming the liquid compound 240, and the air in the openings 23 is evacuated by utilizing the air gap I connecting the openings 23 and air slot hole 24, so as to prevent the air from being encapsulated by the liquid compound 240 to form voids.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flip chip package process, comprising:
   providing a substrate strip, wherein the substrate strip comprises at least one substrate and comprises an upper surface and a lower surface;
   disposing at least one chip on the substrate, wherein the chip is electrically connected to the substrate;
   disposing a stencil on the upper surface of the substrate strip, so as forming an air gap between the stencil and the substrate strip, wherein the stencil comprises a first surface, a second surface, at least one opening extending from the first surface to the second surface, and at least one air slot hole forming on the second surface, the air gap connecting the opening and the air slot hole, and the chip is located in the opening; and
   forming a liquid compound into the opening of the stencil to encapsulate the chip, and performing a vacuum process to evacuate the air from the opening through the air slot hole and the air gap.

2. The flip chip package process according to claim 1, wherein the air slot hole is connected with the opening.

3. The flip chip package process according to claim 1, wherein the liquid compound is formed into the opening of the stencil through a squeezing process.

4. The flip chip package process according to claim 1, wherein the substrate comprises a plurality of first connection pads and the chip comprises an active surface, a back surface, and a plurality of bumps, and the bumps are connected to the first connection pads.

5. The flip chip package process according to claim 4, further comprising:
   disposing a screen on the first surface of the stencil, wherein the screen comprises at least one masking part and a plurality of hollow parts, and the masking part covers the back surface of the chip.

6. The flip chip package process according to claim 4, further comprising:
   forming an underfill on the upper surface of the substrate strip, wherein the underfill encapsulates the bumps of the chip and exposes the back surface of the chip.

7. The flip chip package process according to claim 4, wherein the liquid compound exposes the back surface of the chip.

8. The flip chip package process according to claim 1, further comprising performing a heating process to cure the liquid compound.

9. The flip chip package process according to claim 8, further comprising:
   removing the stencil before curing the liquid compound by heating.

10. The flip chip package process according to claim 1, wherein the substrate further comprises a plurality of second connection pads formed on the lower surface.

11. The flip chip package process according to claim 10, further comprising:
    disposing a plurality of solder balls on the lower surface of the substrate strip, wherein the solder balls are connected to the second connection pads.

12. The flip chip package process according to claim 1, further comprising:
    cutting the substrate strip into a plurality of isolated flip chip package structures.

* * * * *